US005776787A

United States Patent [19]

Keshtbod

[11] Patent Number: 5,776,787

[45] **Date of Patent: *Jul. 7, 1998**

[54] SPACER FLASH CELL PROCESS

[75] Inventor: Parviz Keshtbod, Los Altos Hills, Calif.

[73] Assignee: Cirrus Logic, Inc., Fremont, Calif.

[ * ] Notice: The term of this patent shall not extend beyond the expiration date of Pat. No. 5,476,801.

[21] Appl. No.: 650,785

[22] Filed: May 20, 1996

Related U.S. Application Data

[60] Division of Ser. No. 413,349, Mar. 30, 1995, Pat. No. 5,640,031, which is a continuation-in-part of Ser. No. 129, 866, Sep. 30, 1993, Pat. No. 5,479,368.

[51] Int. Cl.[6] .................................................. H01L 21/8247

[52] U.S. Cl. .................................. 437/43; 437/44; 437/52

[58] Field of Search .................................... 437/43–44, 52

[56] References Cited

U.S. PATENT DOCUMENTS

| | | | |
|---|---|---|---|
| 4,122,544 | 10/1978 | McElroy | 365/185 |
| 4,203,158 | 5/1980 | Frohman-Bentchkowsky et al. | 365/185 |
| 4,274,012 | 6/1981 | Simko | 307/238.3 |
| 4,295,265 | 10/1981 | Horiuchi et al. | 29/571 |
| 4,332,077 | 6/1982 | Hsu | 29/571 |
| 4,366,555 | 12/1982 | Hu | 365/185 |
| 4,412,311 | 10/1983 | Miccoli et al. | 365/185 |
| 4,462,089 | 7/1984 | Miida et al. | 365/185 |
| 4,471,373 | 9/1984 | Shimizu et al. | 357/41 |
| 4,599,706 | 7/1986 | Guterman | 365/185 |
| 4,622,737 | 11/1986 | Ravaglia | 29/571 |
| 4,727,043 | 2/1988 | Matsumoto et al. | 437/29 |
| 4,754,320 | 6/1988 | Mizutani et al. | 357/23.5 |
| 4,814,286 | 3/1989 | Tam | 437/27 |
| 4,822,750 | 4/1989 | Perlegos et al. | 437/52 |
| 4,853,895 | 8/1989 | Mitchell et al. | 365/185 |
| 4,912,676 | 3/1990 | Paterson et al. | 365/185 |
| 4,964,143 | 10/1990 | Haskell | 357/23.5 |
| 5,019,879 | 5/1991 | Chiu | 357/23.5 |
| 5,029,130 | 7/1991 | Yeh | 365/185 |
| 5,045,488 | 9/1991 | Yeh | 437/43 |
| 5,067,108 | 11/1991 | Jenq | 365/185 |
| 5,108,939 | 4/1992 | Manley et al. | 437/43 |
| 5,126,967 | 6/1992 | Simko | 365/45 |
| 5,187,483 | 2/1993 | Yonemaru | 341/156 |

(List continued on next page.)

OTHER PUBLICATIONS

H.G. Dill and T.N. Toombs, "A New MNOS Charge Storage Effect," Solid-State Electronics, vol. 12, pp. 981–987, Pergamon Press 1969, month unknown.

Yamauchi, et al., "A 5V-Only Virtual Ground Flash Cell with An Auxiliary Gate for High Density and High Speed Application", 1991 IEEE, pp. 11.7.1–11.7.4, month unknown.

*Primary Examiner*—John Niebling
*Assistant Examiner*—Richard A. Booth
*Attorney, Agent, or Firm*—Robert Platt Bell; Steven A. Shaw; Haverstock & Assoc.

[57] ABSTRACT

A flash EPROM cell has a reduced cell size by providing vertical coupling between the floating gate and the bit line during programming. The erase operation is done by tunneling of electrons from the sharp tip of the Poly spacer to the control gate. The cell is adapted so that the source for each cell within the array is the source of an adjacent cell and the drain is the drain to another adjacent cell. The cell is formed by forming the drain regions into the substrate through openings in a first insulator that is preferably the field oxide. A second insulator is deposited over the first insulator, over the substrate and along the side walls of the openings and is preferably a thin layer so that the opening is covered with a thin insulating layer. The insulated opening is filled with a metal, preferably tungsten or a tungsten alloy. The field oxide is selectively removed. A gate oxide is grown and a first polysilicon layer is formed and then etched to form spacers along the edges of the metal/second insulator structure. The first polysilicon is selectively etched and a tunneling insulator layer is formed thereover. A second polysilicon layer is formed over the tunneling insulator.

2 Claims, 13 Drawing Sheets

U.S. PATENT DOCUMENTS 5,220,531 6/1993 Blyth et al. .......................... 365/189.07
5,240,870 8/1993 Bergemont .................................. 437/43
5,241,507 8/1993 Fong ........................................ 365/218
5,252,847 10/1993 Arima et al. ............................ 257/320
5,256,584 10/1993 Hartmann .................................. 437/43
5,270,562 12/1993 Wuidart ................................... 257/315
5,293,328 3/1994 Amin et al. ............................. 365/185
5,476,801 12/1995 Keshtbod .................................. 437/43
5,543,339 8/1996 Roth et al. ................................ 437/43
5,571,736 11/1996 Paterson et al. .......................... 437/43

SPACER FLASH CELL PROCESS

This application is a divisional application of U.S. patent application, Ser. No. 08/413,349, filed on Mar. 30, 1995 now U.S. Pat. No. 5,640,031 which is a continuation-in-part of U.S. Ser. No. 08/129,866, filed on Sep. 30, 1993, of U.S. Pat. No. 5,479,368 issued on Dec. 26, 1995.

FIELD OF THE INVENTION

This invention relates to the field of processes for manufacturing semiconductor electronic devices. More particularly, this invention relates to a process for forming flash EPROM memory cells using a spacer technology.

BACKGROUND OF THE INVENTION

The non-volatile electrically programmable and erasable memory devices sometimes referred to as flash devices are explained in a variety of operations in the prior art. The section of this group called EEPROMs generally include two serially connected N-channel metal oxide semiconductor transistors, in which one of the transistors has an additional control gate that is floating and is sandwiched between the gate and the channel. This gate is used to store positive or negative charges which determine the state of the EEPROM. The other transistor is used for selection purposes. The charging of the floating gate is done by Fowler-Nordheim tunneling of electrons out of or into the floating gate. The oxide layer between the channel and the floating gate is around 100 Å as reported in the prior art. These conventional flash devices require high voltages, are slow for programming and they occupy a large space due to the large capacitive coupling that is required between the floating gate and the control gate.

Another type of flash device as reported in (Intel flash patent) utilizes a single N-MOS transistor with a floating gate inserted between the control gate and the channel of the device. The oxide thickness for these type of flash cells is also around 100 Å. The storing of the negative charge into the floating gate is achieved by injection of high energy electrons generated in the channel during charge transport between the source and the drain of the transistor. This requires a much lower voltage on the control gate but requires a larger source to drain current. The erase or removal of the negative charge is done exactly like the EEPROM cell with the exception that it should be performed under control to prevent over erasing of the cell, which leaves positive charge on the floating gate so that the transistor will remain "on" all the time and the cell selectivity will be lost. This type of flash cell which is smaller than the EEPROM cell and requires lower programming voltage but suffers from over erase and high current requirements. The high current requirements for this type of flash cell make it unsuitable for applications that use a battery as its power source. A further complication in this type of flash cell comes from the control of the erase voltage Vt. Since over erase has to be avoided for all the cells in the memory, the lower limit for the Vt of the erased cell can not be less than 0.5 V. Since all the cells do not erase the same way, there can be cells in the memory with Vt as high as 3.0 volts. A Vt of 3.0V makes it impossible to operate the cell with 3 volts as a control voltage on the gate.

In my co-pending U.S. patent application, Ser. No. 08/129,866, filed on Sep. 30, 1993, now U.S. Pat. No. 5,479,368 I disclose a flash EPROM cell and a process for forming that cell. The invention disclosed in that application solves many of the problems associated with the prior art.

The entirety of my co-pending application is incorporated herein by reference.

There is considerable effort in the industry directed toward replacing rotating medium hard disks with non-volatile semiconductor memory. My previous invention is useful for such an application because the cell size can be made very small. The cell size can be small because the gate length of the floating gate is short. Further, the width of the channel can also be reduced. This provides two advantages, first the cell size is further reduced and the current drawn by the cell is also small. The reduced current slows the read access operation of a device according to my previous invention to an estimated 200 nS. However, in an application for replacing hard disks this will not be a problem as hard disk access is far slower than such a cell.

In my previous cell, the bit line is formed of doped polysilicon. Because current flows through the bit line, and because the impedance of a doped polysilicon line is approximately 30 Ω/□ the size of a memory made according to the invention is limited. What is needed is a flash memory cell that provides small dimensions in a single while allowing for the formation of very large memories.

BRIEF DESCRIPTION OF THE TABLE

Figure 1A:
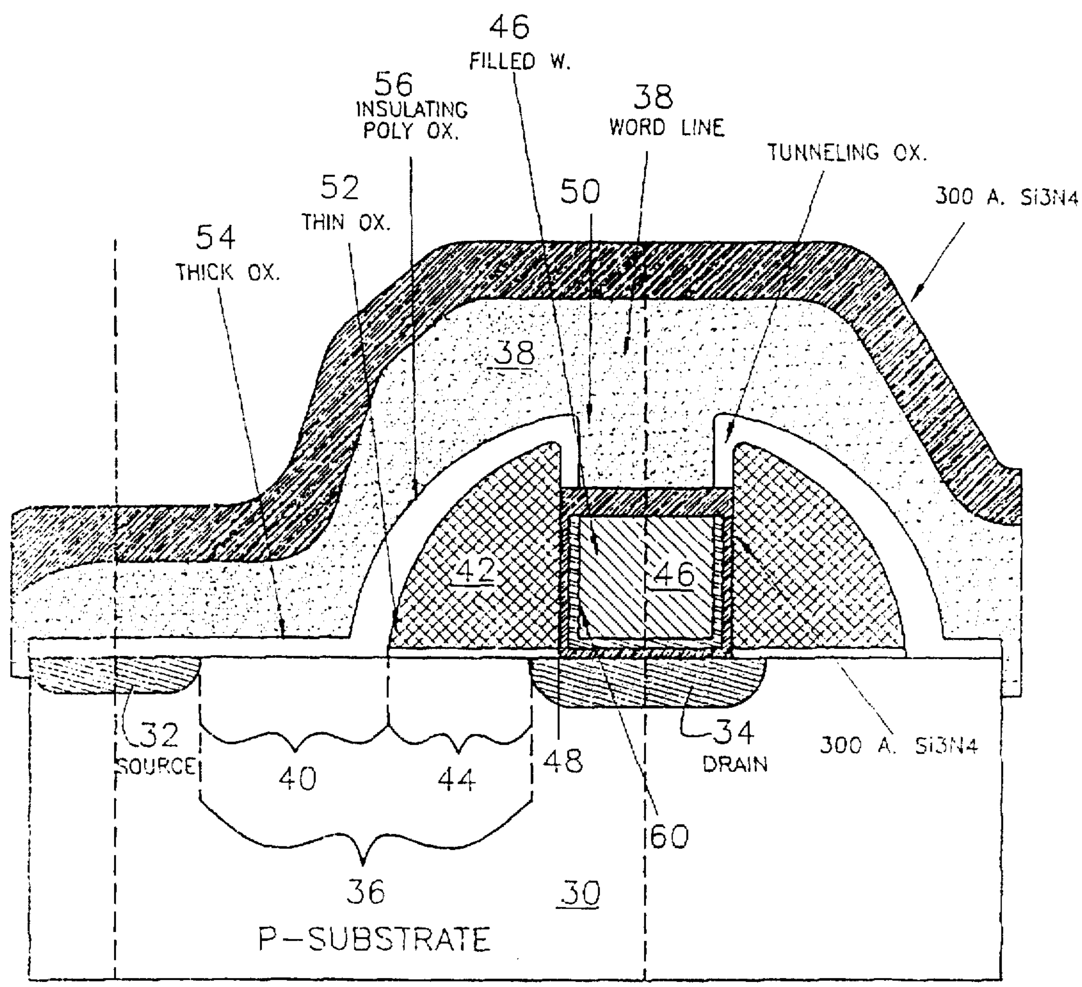
FIG. 1A shows a cross section diagram of a cell manufactured according to the present invention.

Table I depicts a manufacturing process for building a flash EPROM cell according to the present invention.

SUMMARY OF THE INVENTION

A flash cell is disclosed which uses a floating polysilicon spacer as a storage element. A silicon nitride layer is preferably used as the coupling medium between the cell bit line and the floating storage element. The bit line of the cell is formed by filling a trench formed in field oxide with tungsten and then removing the field oxide in the cell area. Because the bit line carries current, the impedance of the bit line can impact the number of cells incorporated into a single design. Tungsten has about 1/20 the impedance of a similar volume of doped polysilicon. Thus, the use of tungsten allows for a significantly greater number of memory cells to be incorporated into a single flash memory integrated circuit. Other conventional refractory metals can also be used with success depending upon ease of deposition and impedance. Tungsten was selected because it is readily available and easily deposited. In this specification, tungsten can also be understood to mean any conventionally used tungsten alloy.

Additionally, by removing the field oxide, the cell area is relatively flat compared to prior art flash cells. This provides a further basis for reducing the size of the cells.

Pure silicon nitride insulating layer provides a higher coupling between the bit line and the floating storage element due to a higher dielectric constant as compared to silicon nitride/silicon dioxide (OND) layers which are used in the prior art for coupling floating gates to control elements. This higher coupling allows lower voltages to be used during programming.

The storage element forms a floating gate transistor which is in series with the control transistor. The channel of the transistor is split insofar as control of the channel is concerned. The floating gate controls a relatively small portion of the channel adjacent the drain. The control gate controls the remainder of the channel.

The gate of the control transistor is separated from the storage element by a thick oxide layer. This layer reduces the coupling between the floating gate and the control gate in contrast to the prior art which uses a silicon nitride/oxide layer to maximize this coupling. The low coupling between the control gate and the floating gate keeps the floating gate transistor "off" with a very small amount of negative charge on the floating gate which makes the flash cell of the present invention program quickly with low voltage requirements on the drain and word line.

The programming and erase operations are performed using entirely different phenomenon and through entirely different insulating layers. A programming operation occurs through hot electron injection from the substrate to the floating gate through the thin gate oxide. An erase operation is done through a thin tunneling oxide grown on an upper portion of the floating gate storage element from the floating gate to the control gate.

To grow this thin tunneling oxide layer, a small portion of the silicon nitride on the side of the floating gate is removed and then the thin oxide layer is grown. The electrons trapped in the floating gate will tunnel through this thin oxide layer due to the application of a high voltage on the control gate while the other electrodes are grounded.

It is preferred to tunnel excess electrons from the floating gate to leave it positively charged. This is in contrast to the prior art which teaches away from this phenomenon called over erase. The control gate and the drain of the cell are not connected together. During all programming operations, the drain is connected to a high voltage on the order of 10–12V and control gate to 1.5–2V. During a read operation the source is coupled to a low voltage of around 2V. The bit line voltage is zero. Connecting the bit line to zero volt reduces the voltage coupled to the floating gate and therefore reduces the negative voltage requirement on the floating gate to keep the cell off even further.

DETAILED DESCRIPTION OF THE PREFERRED EMBODIMENT

The present invention is preferably directed toward a CMOS process and will be so described. However, it will be apparent to a person of ordinary skill in the art that the principle features of the present invention can be applied equally well to NMOS or PMOS processes.

The cell structure

The cell of the preferred embodiment is shown in FIG. 1. The cell is formed on a p-type semiconductor substrate 30. The cell includes a drain 34, a source 32, a cell channel 36 that is split into a channel 40 of the control transistor and a channel 44 of the cell's floating gate transistor. The drain 34 is shared with the cell located to the right of the illustrated cell and the source 32 is shared with the cell located to the left of the illustrated cell. The floating gate 42 is capacitively coupled to the bit line 46 via the insulator 48.

The floating gate 42 and the channel 44 form the floating gate transistor that determines the status of the cell. A thin gate oxide 52 is formed between the floating gate 42 and the channel 44. Negative charge that is stored in the floating gate cuts off the current flow in the channel 44, this is called the "off" state of the cell. Positive charge on the floating gate 42 keeps the channel on for the floating gate transistor which is called the "on" state of the cell. The control gate 38 and channel 40 form the control transistor that is used for cell selection. A thick gate oxide 54 is formed between the control gate 38 and the channel 40. If negative charge is stored on the floating gate 42, no current can flow from the source 32 to the drain 34 regardless of the potential applied to the control gate 38 (assuming normal operating potentials). Similarly, if the negative charge is removed from the floating gate 42, the control gate 38 determines whether current flows from the source 32 to the drain 34.

The insulating oxide layer 56 is formed between the floating gate 42 and the control gate 38. The thickness of this oxide layer 56 is preferred to be more than 1000 Å to minimize the capacitive coupling between the floating gate 42 and the control gate 38 to insure independent operation of the control transistor and the floating gate transistor.

The bit line 46 is formed by filling a trench with tungsten. Other conventional metals can also be used with success depending upon ease of deposition and impedance. Tungsten was selected because it is readily available and easily deposited. In this specification, tungsten can also be understood to mean any conventionally used tungsten alloy. As is well known, it is difficult to have tungsten adhere to typical semiconductor structures. Accordingly, an adhesion layer of Titanium nitride 60 is applied between the tungsten bit line 46 and the silicon nitride insulator 48. The tungsten fill 48 is recessed to allow etching of a small portion of the silicon nitride insulator 58.

A tunneling oxide layer 50 is grown on the floating gate 42 in the region from which that silicon nitride layer was removed to a thickness between 120 Å and 200 Å. The floating gate 42 is formed of a polysilicon spacer. This polysilicon spacer is formed by anisotropically etching a polysilicon layer that was deposited on a step formed by the bit line. The resulting spacer (floating gate 42) will have a sharp corner on top. This sharp corner will enhance the electric field in the thin oxide layer 50 which helps to reduce the erase time and erase voltage required.

Figure 1B:
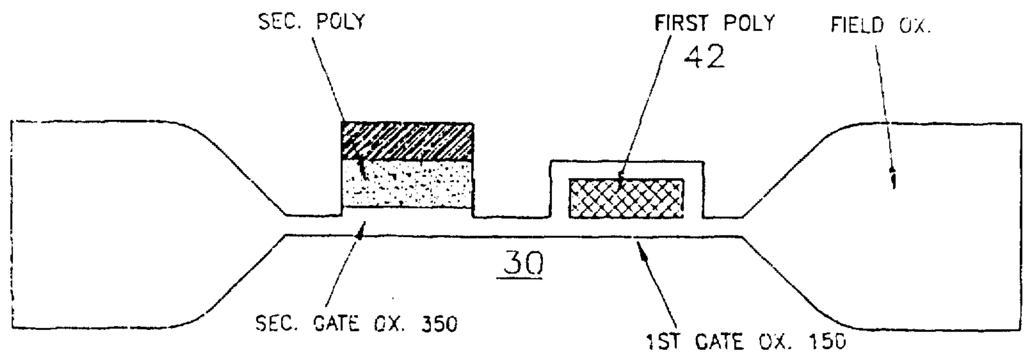
FIG. 1B shows a cross section diagram of the completed process in the periphery of an integrated circuit made according to the process of the present invention.

FIG. 1B shows a section of the process made in the active region. In other words, this section is made in the periphery of the memory device rather than in the cells.

Figure 2:
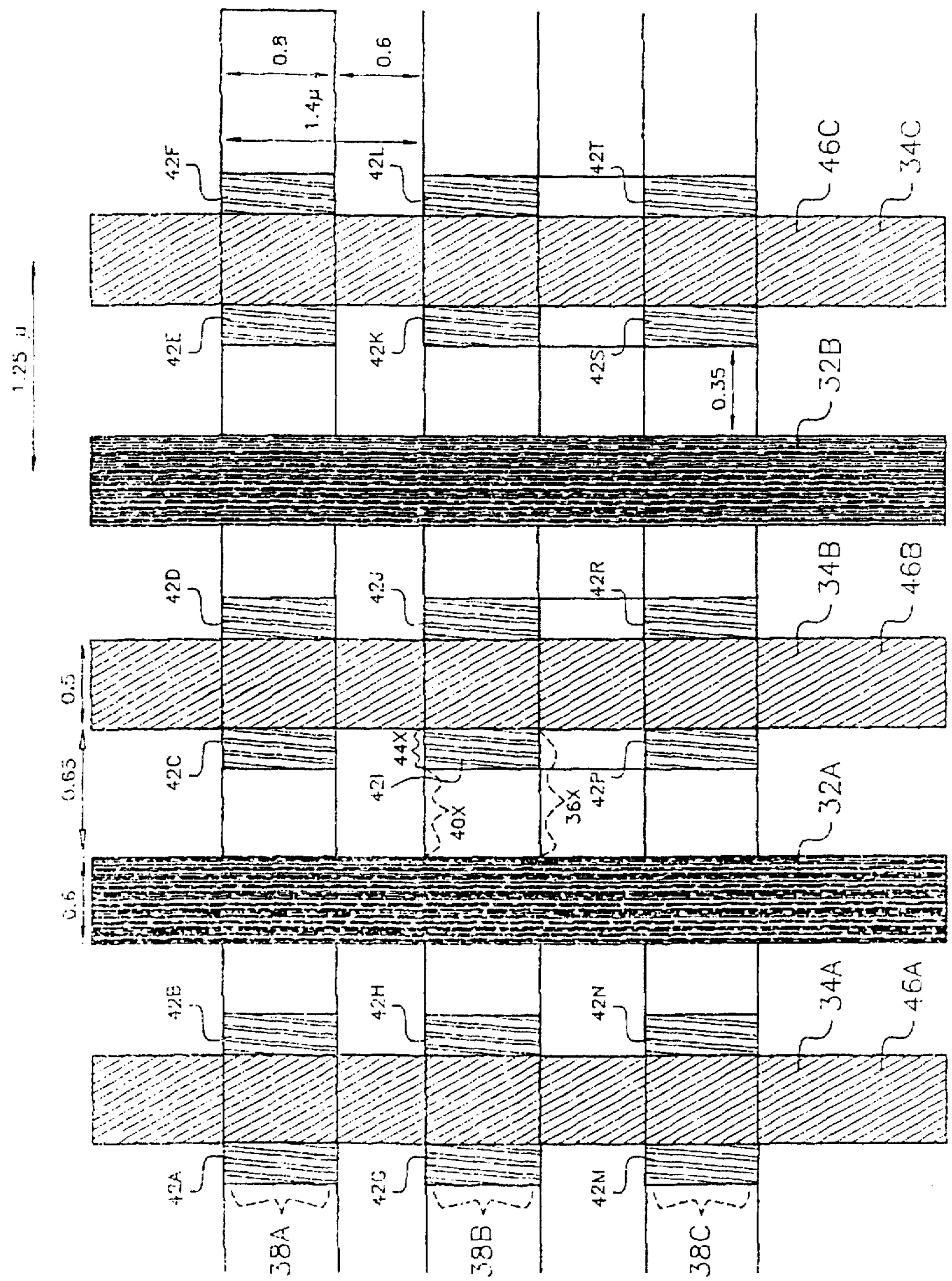
FIG. 2 shows a geometric layout for a portion of a memory array manufactured according to the present invention.

FIG. 2 shows a plan view of a portion of an array of cells such as that shown in FIG. 1. Because there are more than one of each of the elements of FIG. 1, those shown in FIG. 2 will be labeled with alpha suffixes to distinguish between the various similar elements. Twelve complete cells and six partial cells are shown. It will be understood by a person of ordinary skill in the art that a drain 34X is formed under each bit line 46X and is thus obscured in the drawing of FIG. 2. According to the reference numerals for the drains 34X are shown as ghosts.

One cell will be identified. A source 32A and its drain 34B are coupled to one another via a channel 36X. A control gate 38B is coupled to control a portion 40X of the channel 36X. A floating gate 42I is configured to control a second portion of the channel 44X. By applying an appropriate voltage signal to the control gate 38A the channel 36X will provide a path for current flow from the source to the drain depending upon whether or not the floating gate 42I has been programmed.

Cell Operation

The operation of the cell is described with reference to the cell illustrated in FIG. 1. It will be readily understood by a person of ordinary skill in the art that these voltages can be applied to one or more additional cells sequentially or in parallel with these signals for a single cell depending upon the system performance requirements. This parallel operation can be used for example when programming a word of data. Preferably, the word to be stored will be intermediately stored in a register. From the register, the data will be programmed into the appropriate cell of the memory array.

Programming A Cell To program a cell a voltage on the order of 10 to 12 volts is applied to the drain 34 and the bit line 46 of the cell. The bit line 46 and floating gate 42 are relatively strongly capacitively coupled to each other. The capacitive coupling factor between these electrodes is preferably about 0.75. Thus, with the application of 10 to 12 V on the bit line 46 and the drain 34, 7.5 to 9.0 V will appear on the floating gate 42. At the same time the source 32 is connected to ground and the control gate 38 is connected to 1.5 to 2 V. This voltage is 0.5 to 1 V larger than the threshold voltage of the control transistor.

Under such conditions the channel 40 is inverted and channel 44 is very strongly inverted. This is especially true since the threshold of the floating gate transistor is close to zero, and a high voltage (7.5 to 9.0 V) is on the floating gate 42. The gap between the channels 40 and 44 is weakly inverted by fringing fields of the gates 38 and 42. Due to high drain and low gate voltage on the control gate 38 the electrons entering the channel 40 from the source 32, accelerate toward the channel 44 under the high horizontal electric field. The electric field is especially high in the gap between channels 44 and 40. This is due to a weak inversion in this region which results in a small number of electrons carrying the current, and since the total current is constant from the source 32 and the drain 44 the electrons have to move faster in a higher electric field. Some of these fast moving electrons are injected into the floating gate that has the highest potential. In the art, this phenomenon is known as hot electron injection.

As electrons are injected into the floating gate, its potential drops to the point that the channel region 44 cannot maintain inversion. At this time, the current decreases and programming of the cell stops. Since a slowdown in programming happens gradually, a user need not wait for the channel to completely cut off, but can stop the programming operation when the voltage on the floating gate 42 drops approximately 3 to 4 V. It will be apparent to some one of ordinary skill in the art that at a higher potential on the bit line 46 and the drain 34 this change will happen in shorter time. With the removal of the programming voltages on the bit line 46 and the drain 34, approximately 3 to 4 volts of negative charge will be trapped on the floating gate 42 which prevents the channel 44 from inverting.

Reading a cell

To read a cell the drain 34 is connected to the ground potential, the source 32 is connected to 1 to 1.5 V, and the control gate 38 to 3 to 5 V. The capacitive coupling factor between control gate 38 and the floating gate 42 is very small; on the order of 0.1 to 0.15 and preferably 0.10. Under these conditions the total voltage coupled to the floating gate 42 will be 1.1 to 1.95 volts. In an erased cell the floating gate usually has positive charge due to an over erase condition that happens naturally. Over erase is not required for the operation of the cell but during an erase cycle it usually happens and no effort will be put into preventing it. Indeed, because of the split channel operation of the cell, an over erase condition will have no impact on the operation of the cell.

In any case, the threshold of the floating gate transistor with the channel 44 is either zero or negative, and the channel 44 will be inverted with proper read voltages applied to proper cell elements. The channel 40 of the control transistor is also inverted due to the application of 3 to 5 V to the control gate 38. This causes the current to flow from the drain 34 to the source 32.

In a programmed cell the negative charge that is stored on the floating gate 42 exceeds the capacitively coupled positive charges from the control gate 38 so that the channel 44 cannot become inverted, thereby preventing current flow between the drain 34 and the source 32. During a read operation the bit line 46 can be coupled to 1 to 1.5V while the source 32 is connected to ground. This increases the amount of charge that is coupled to the floating gate 42 to a slightly higher value, but the read operation still can be done successfully.

Erasing a cell

The cell erase operation is done by application of a voltage to the control gate 38 while the other electrodes are coupled to a ground potential. The voltage required depends on the erase speed requirement, a shorter duration erase requires higher voltage on the control gate. A typical erase voltage is around 12 to 15 V for the cell of the present invention. During an erase cycle the charges that are trapped in the floating gate 42 tunnel through the tunneling oxide layer 50 to leave the floating gate 42, thereby increasing the potential on the floating gate 42. As is now apparent, the programming and erase operations are carried out through different insulating layers and using different phenomenon.

As the potential on the floating gate 42 rises, the difference between the floating gate voltage and the control gate voltage becomes less and less which slows the tunnelling process. This means that the erasure of an un-programmed cell would not harm the cell since a positive voltage on the floating gate 42 would build up faster and erasure stops sooner than for a programmed cell. In this operation all the cells sharing the same common control gate 38 will erase. This is called a sector erase operation in prior art, since all the cells containing one sector worth of data have a common control gate. This is particularly advantageous for formation of a semiconductor hard disk. This is because hard disks are commercially available with sector erase functions. Selective cell erase operation is also possible by application of proper voltage to the bit lines and drains of the cells that are preferred to stay programmed.

The preferred process for forming the flash cell in combination with a CMOS process This patent document also teaches the art of making a flash cell of the present invention by adding process steps to a conventional CMOS process such as those known to a person skilled in the semiconductor prior art. The process for the preferred embodiment is outlined in Table 1, which uses many process steps commonly found in a conventional N-Well CMOS process.

After the wafer is processed through an N-well process, diffusion masking and appropriate etches, and field oxidation, a bit line mask is used to make deep trenches in the field oxide. The trenches are etched all the way to the silicon substrate. Arsenic is then implanted selectively into the trenches to form the drain of the cell. A thin layer of silicon nitride on the order of 300 to 500 Å is then deposited over the entire wafer covering the field oxide and the bottom and side walls of all the trenches, insulating the bit lines from the drains of the cells.

A buried contact mask can be used to connect the bit lines to the drains of the cells. This is optional and one could use other means of connecting the two together, as an example metal and contacts. The wafer is then coated with a thin adhesion layer such as Titanium nitride. The trenches are then filled with tungsten. This is done by covering the wafer with tungsten. The tungsten layer is etched back to leave tungsten only in the trenches. The tungsten etched so that the trenches are not filled to the top. The exposed portion of the adhesion layer is also removed. The silicon nitride which covers the face of the wafer is not removed during this process.

At this point in the process (steps XI and XII in Table 1) a silicon nitride layer is deposited on the wafer and then etched back to a level even with the top of the trenches. After this passivation step the silicon nitride that was used to define the active area is removed using any convenient operation such as those known in the prior art. In step XIII a mask is used to selectively remove the field oxide in the cell areas, this causes the tungsten and silicon nitride filled trenches to stand out as ridges with silicon nitride covering their sides. Vt adjustments are made and a thin gate oxide layer is grown.

Figure 12A:
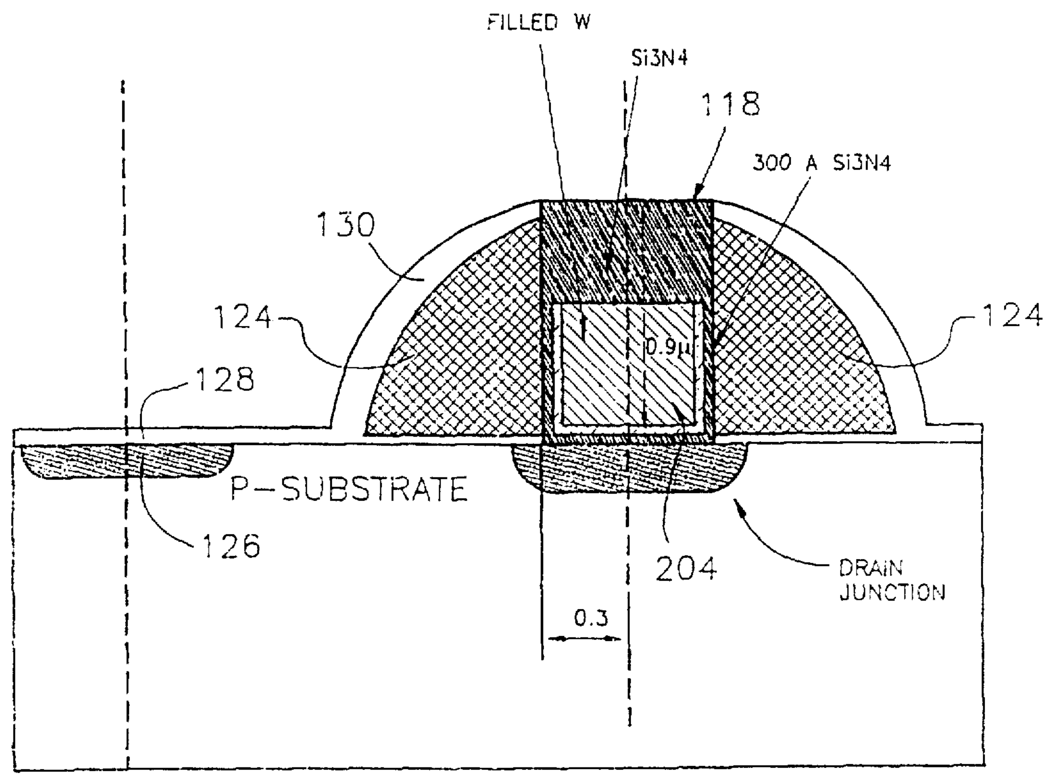
FIGS. 12A and 13A show cross sections of the semiconductor device of FIG. 1A in the cell area after the various stages of the steps of a process that embody the present invention.
Figure 13A:
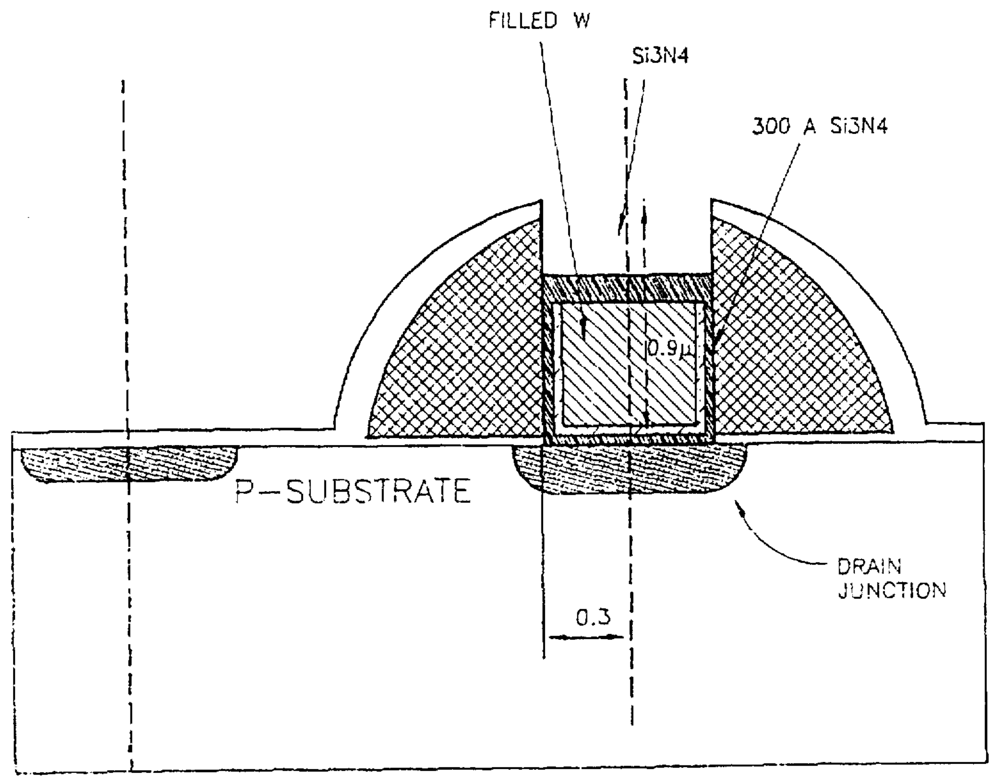
Figure 13B:
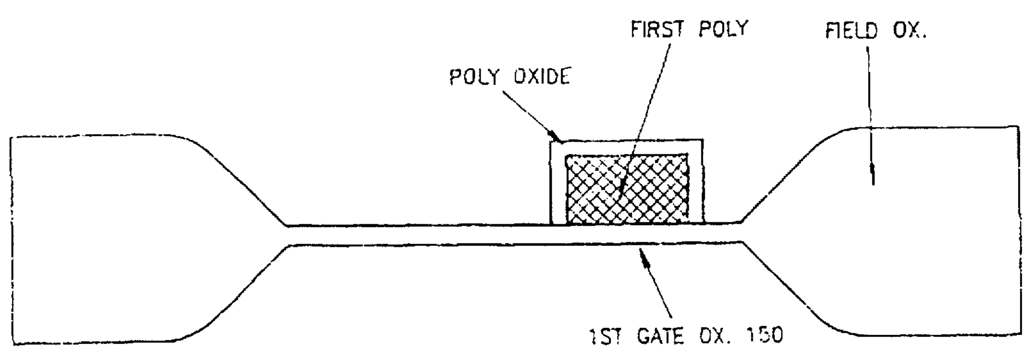

A thick layer of polysilicon is now deposited. The polysilicon is then masked to form thin oxide transistors in the periphery and poly spacers in the cell array. The source of the cell now is formed by the masking and implantation of arsenic. In the following step, all the oxide on top of the polysilicon is dipped off and about 350 Å of an oxide layer is grown in the exposed silicon areas. This oxide layer forms the gate oxide for the control transistor in the cell as well as all the transistors in the periphery that handle voltages larger than 7 volts. FIG. 12A shows how the polysilicon layer is situated with respect to the bit line at this point in the process. The exposed portion of the silicon nitride then is etched in hot phosphoric acid and a tunneling oxide layer of 200 Å is grown on the polysilicon (FIG. 13A).

A third polysilicon layer now is deposited and defined to form the control gate of the cell as well as high voltage transistor gates. After the definition of this poly, the exposed portion of the spacer will be removed and self-aligns to the control polysilicon layer as is known in the prior art. It might be necessary to use one extra mask during self aligned etching to prevent damage to buried N+that is used as the source of the cell. This step is followed with an oxidation which seals the sides of the floating polys to prevent charges from leaking out. The rest of the processing steps are very similar to conventional CMOS processes that are well known in the prior art.

A more detailed description of the process relative to the drawings of FIGS. 3 through 13 follows. A semiconductor wafer is used as a substrate. The wafer is masked using any known masking technique.

In the description that follows, where appropriate, each section of the text relating to an individual step of the process illustrated in TABLE I will be begun with the corresponding Roman numeral. I. The wafer is masked to form N-wells of appropriate size and position. The N-Wells are formed through the photoresist mask by implanting a desired dose of N-type contaminants. II. A nitride layer is applied and masked to selectively prevent formation of a field oxide. A field implant to be used as a channel stop is applied to the wafer. III. A field oxidation is selectively grown to 9000 Å over portions of the wafer. IV. The field oxide is masked and selectively removed to form trenches which expose portions of the substrate. V. Arsenic is implanted through the opening and annealed in subsequent high temperature steps to form the drain. Two drains, for adjacent cells, are formed through each opening.

Figure 3A:
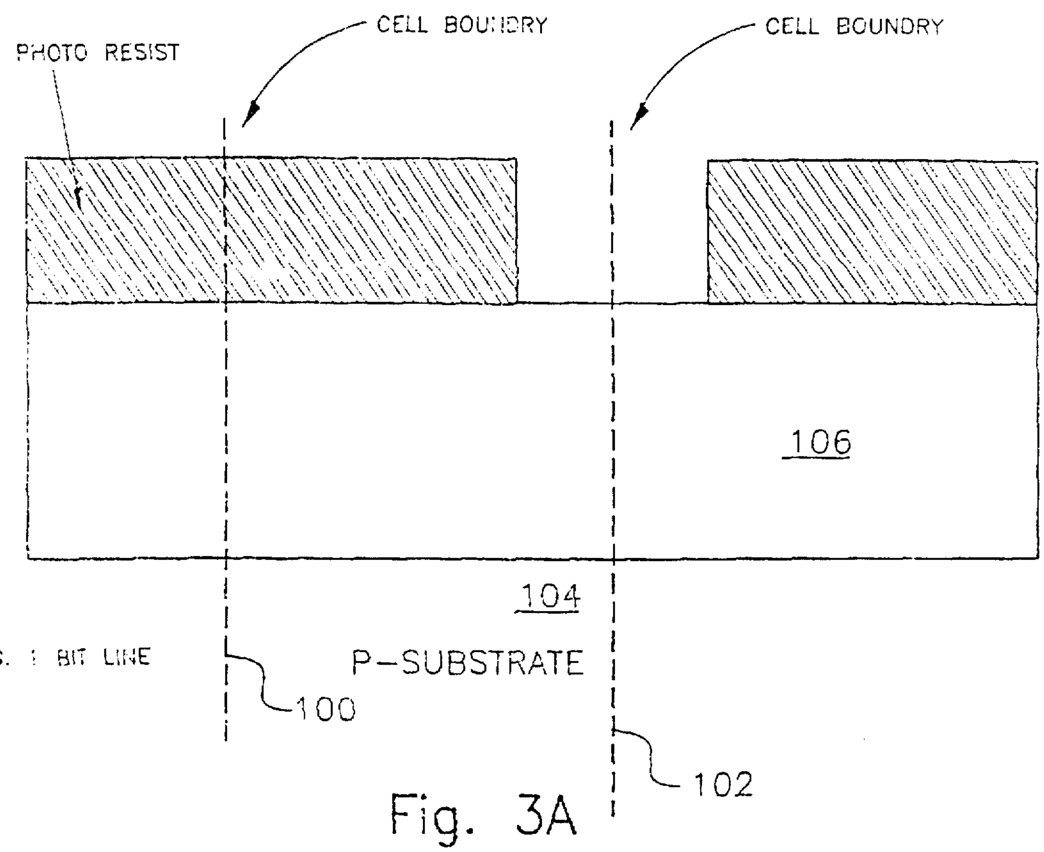
FIGS. 3A, 4A, 5A, 6A, 7A, 8A, 9A, 10A, and 11A show cross sections of the semiconductor device of FIG. 1A in the cell area after the various stages of the steps of a process that embody the present invention.
Figure 3B:
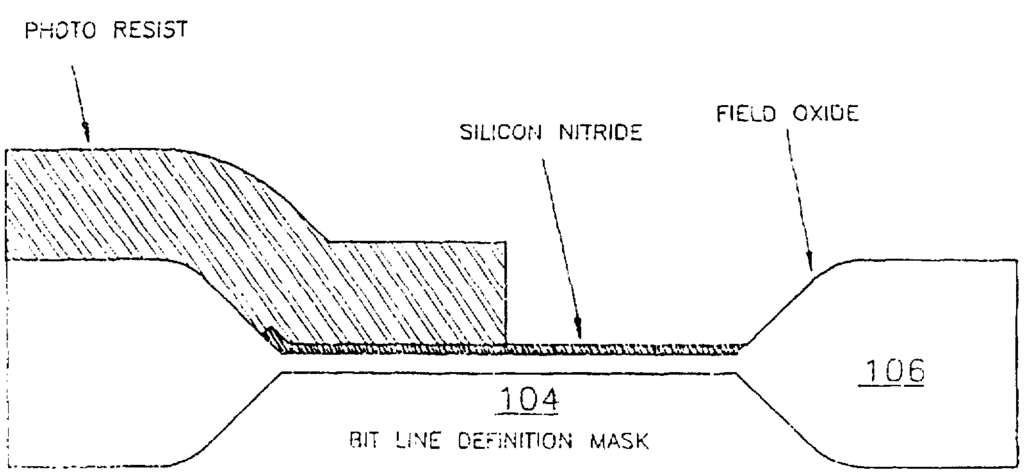
FIGS. 3B, 4B, 5B, 6B, 7B, 8B, 9B, 10, and 11B show cross sections of the semiconductor device of FIG. 1B in the periphery area after the various stages of the steps of a process that embody the present invention.
Figure 4A:
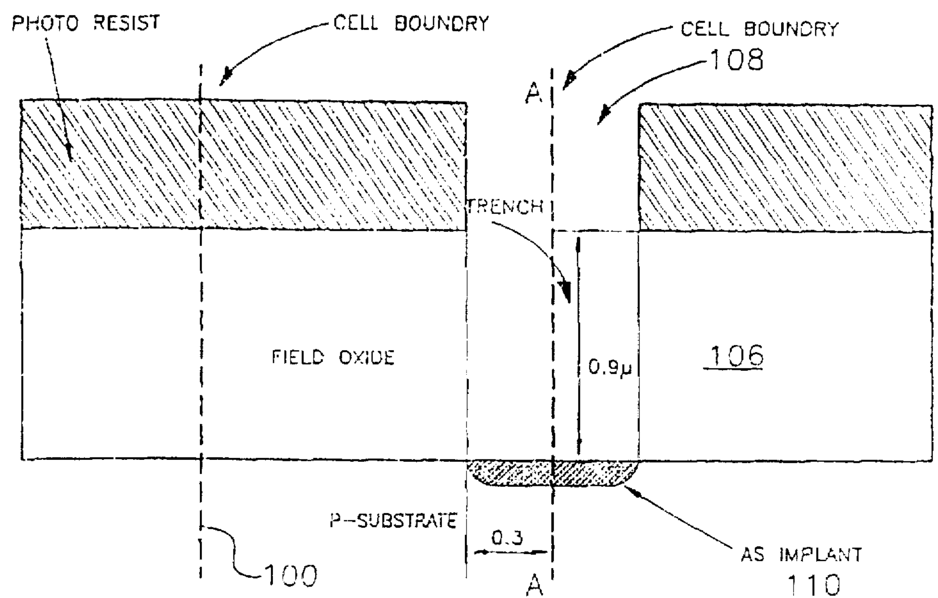
Figure 4B:
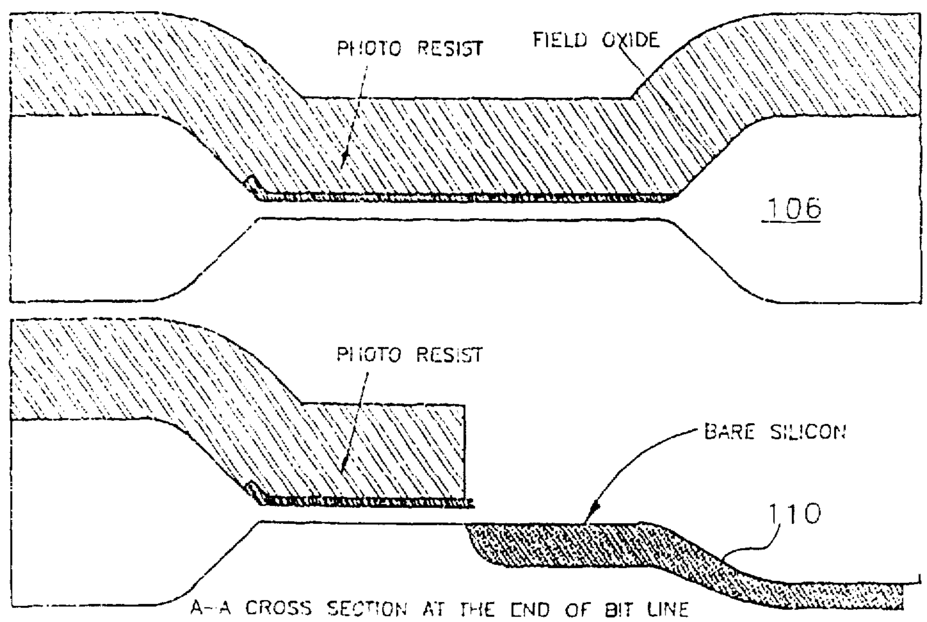

FIG. 3 shows a cross section of a portion of a wafer at this stage of the process. The cell is formed between the two vertical lines 100 and 102 drawn as reference points only. A thick field oxide layer 106 is formed over a P-type substrate 104. In FIG. 4, an opening 108 is shown to have been formed through the field oxide layer 106 which exposes a portion of the substrate 104. A region 110 that will ultimately become the drain to two cells is implanted with Arsenic.

Figure 5A:
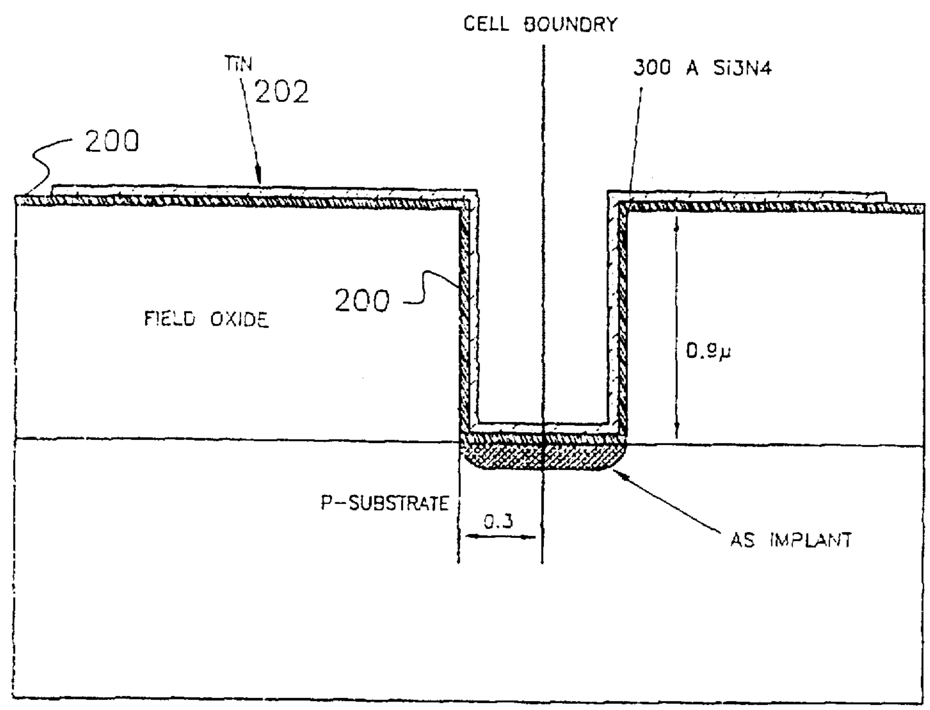
Figure 5B:
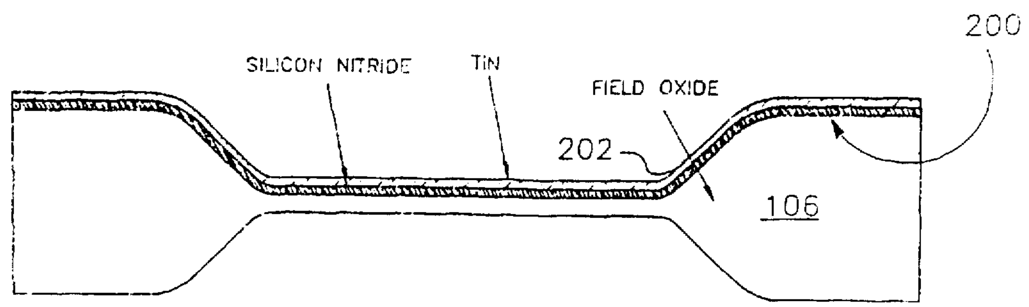

VI. As shown in FIG. 5, a thin layer of nitride ($Si_3N_4$) 200 is deposited over the surface of the structure of FIG. 3. Preferably, this layer is 300 Å thick. VII. Next, a buried contact mask is used to form openings for connecting the tungsten bit line to the diffusion. This is done every 32 or 64 cells. This step can be replaced by a metal connection to the diffusion at a later stage in the process by any conventional technique.

Figure 6A:
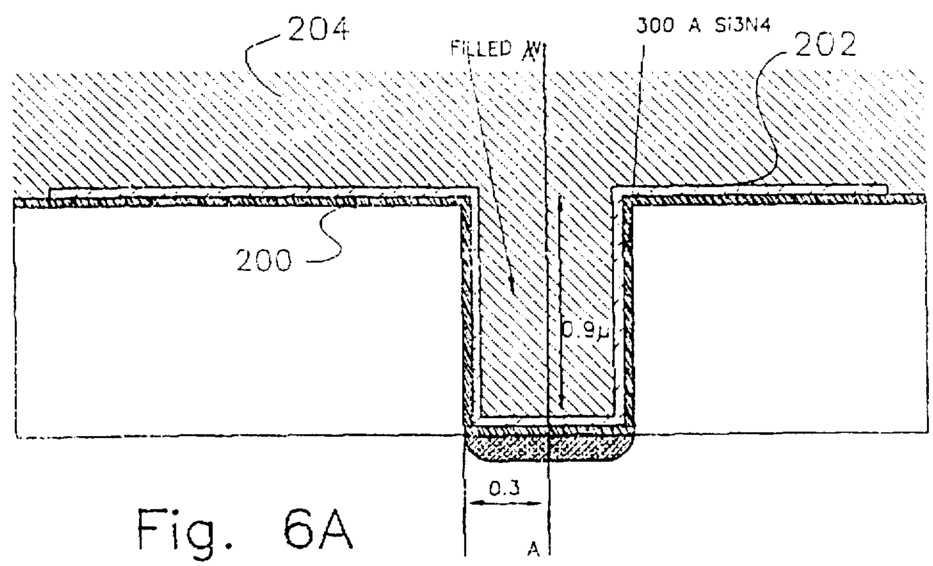
Figure 6B:
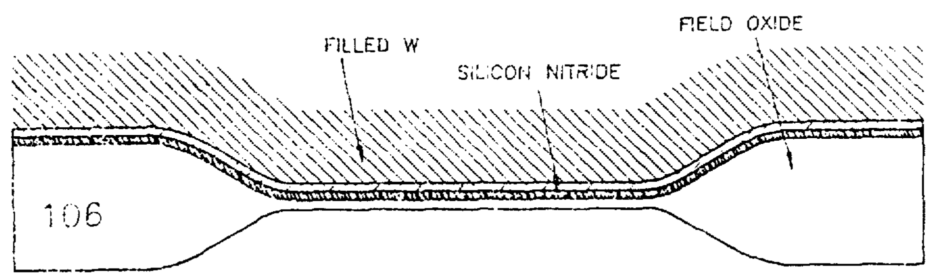
Figure 6B:
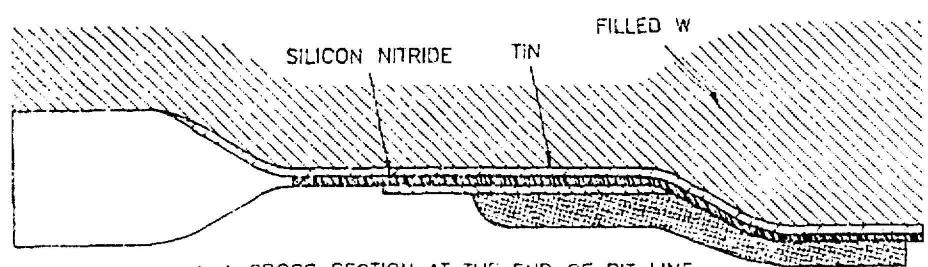

VIII. A thin adhesion layer of titanium nitride 202 is than deposited over the nitride layer 200. IX. A tungsten layer 204 is then deposited onto the surface of the structure as shown in FIG. 6. The deposited tungsten layer 204 should be thicker than 3000 Å so that the trench in the field oxide layer 106 is filled.

Figure 7A:
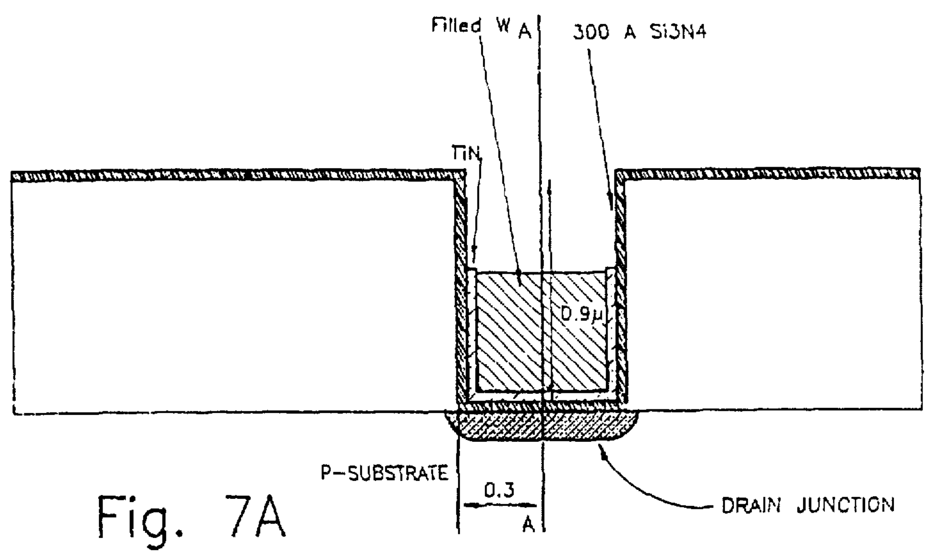
Figure 7B:
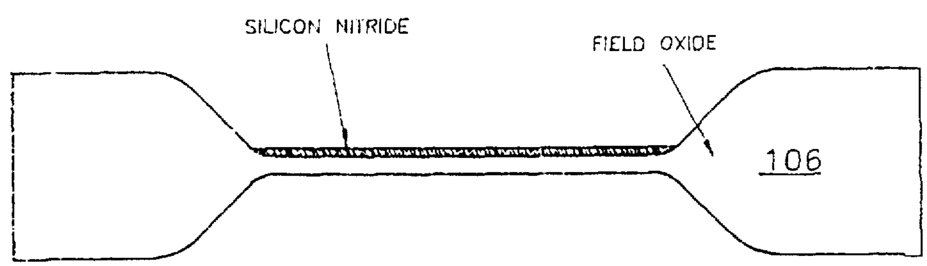
Figure 7B:
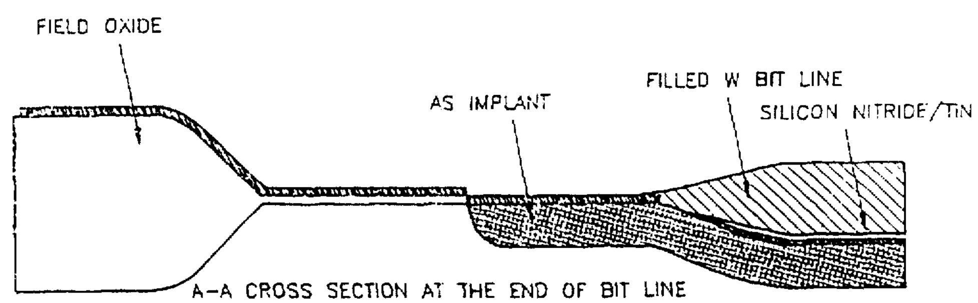
Figure 8A:
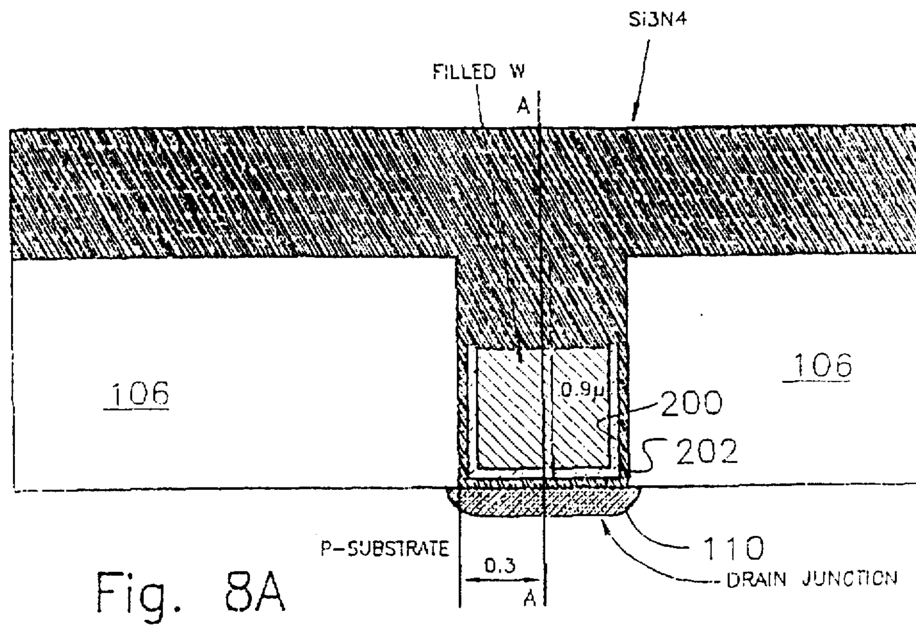
Figure 8B:
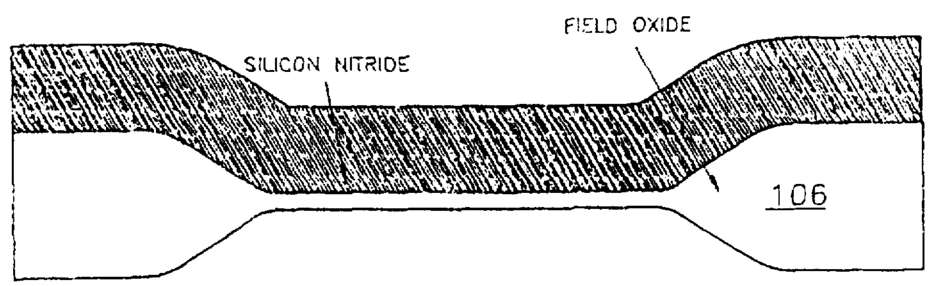
Figure 8B:
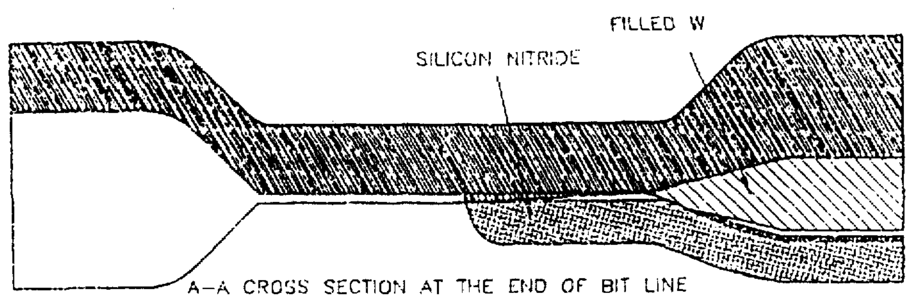
Figure 9A:
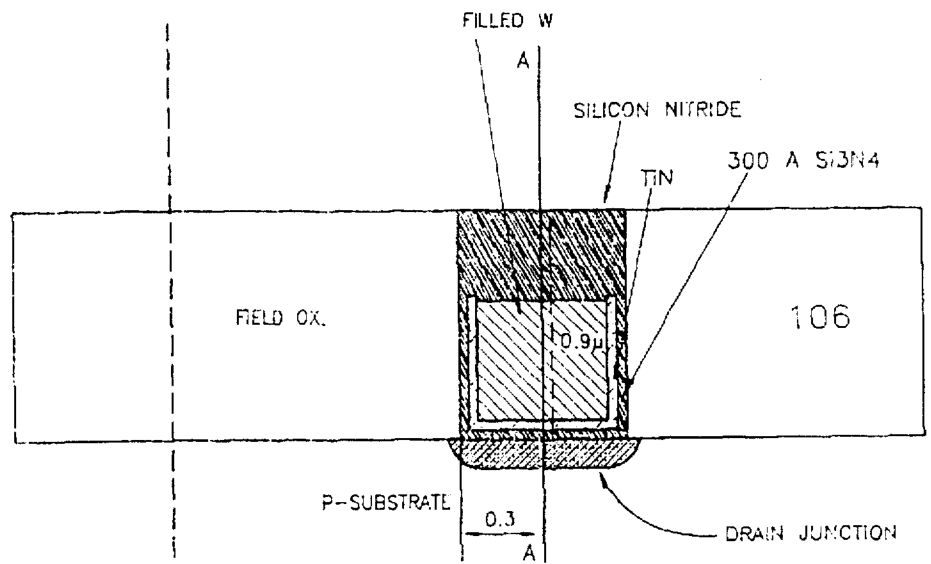
Figure 9B:
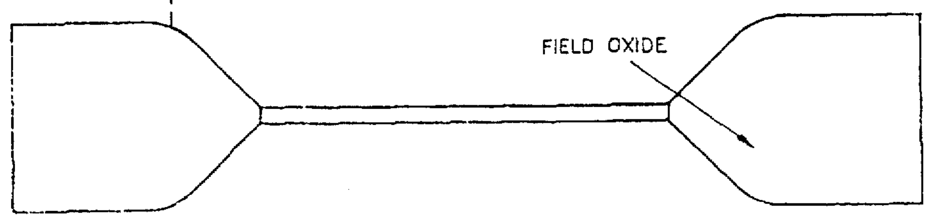
Figure 9B:
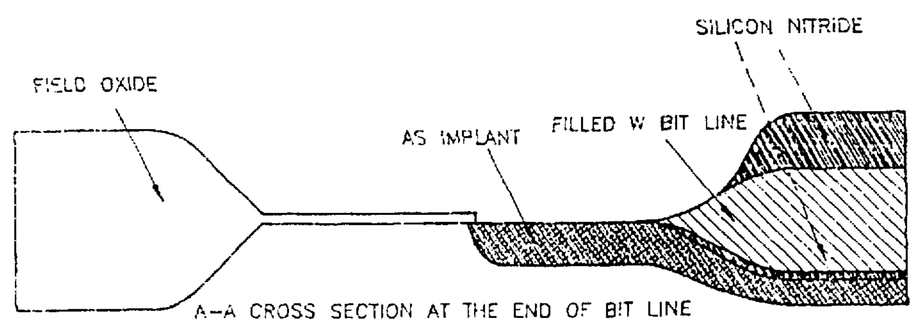

X. The tungsten layer 204 is isotropically etched below the re-exposed surface of the field oxide 106 as shown in FIG. 7. XI. Next, a 1000 Å nitride layer 118 is deposited as shown in FIG. 8. XII. The nitride layer 118 is isotropically etched to a level even with the top of the field oxide layer 106 as shown in FIG. 9.

Figure 10A:
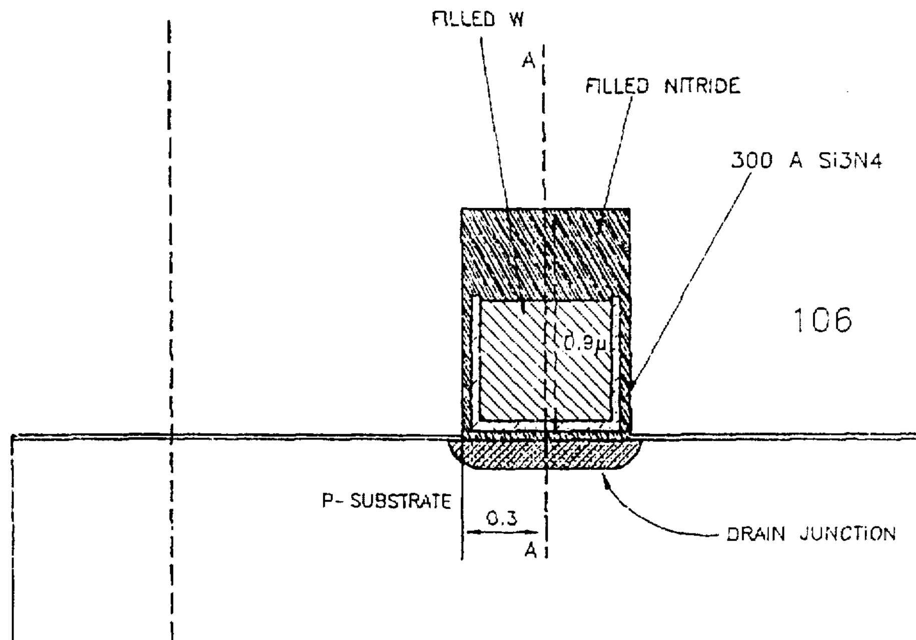
Figure 10B:
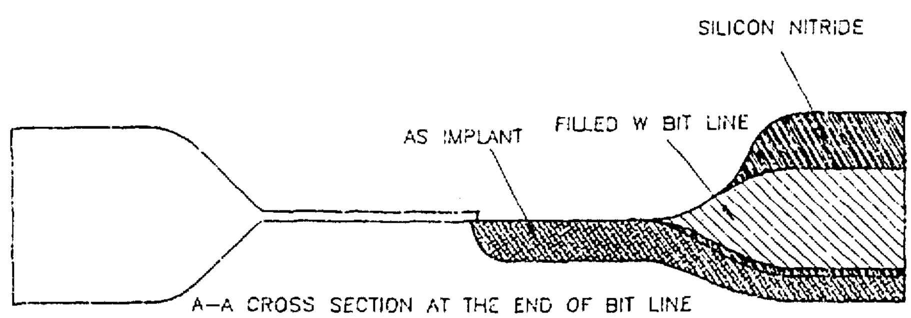

XIII. The wafer is masked, exposing only the cell regions of the circuit. The field oxide is removed by etching to expose single crystal substrate 104 and the structures that filled the trenches which are now ridges as shown in FIG. 10.

XIV. An implant is performed to adjust the threshold voltage of CMOS transistors. XV. This is followed by growing a first gate oxide layer 122 to a thickness of 150 Å. The Vt adjustment implant is not shown to avoid obscuring the invention with unnecessary detail.

Figure 11A:
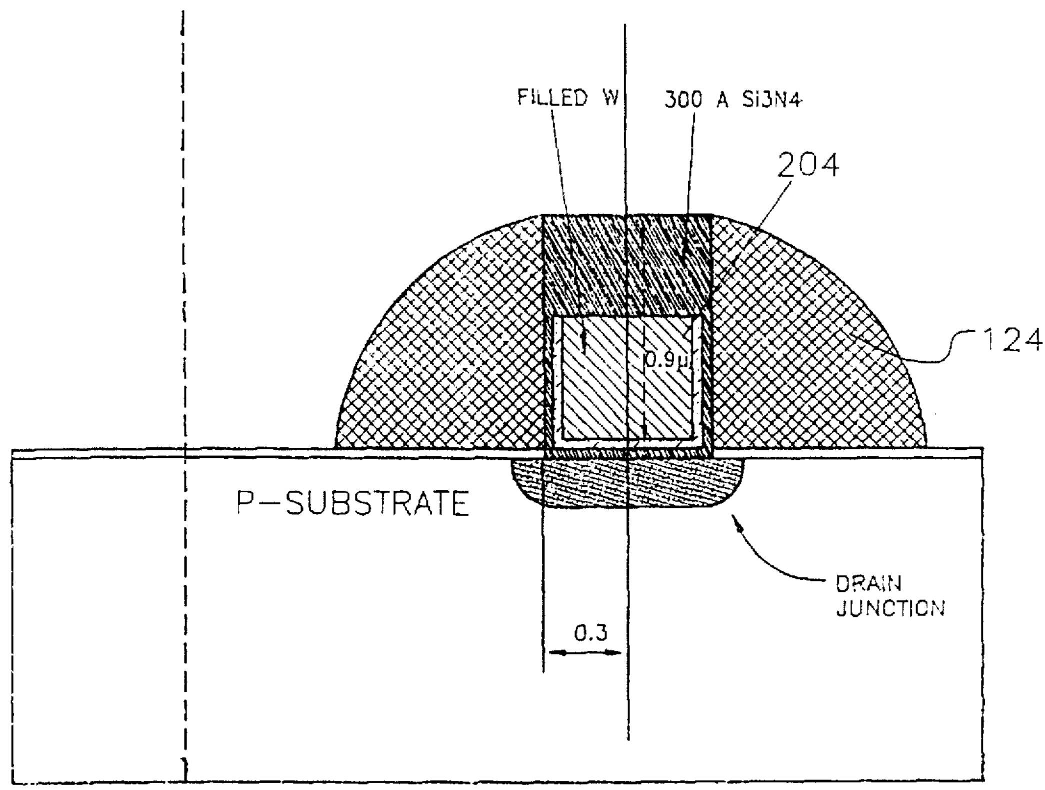
Figure 11B:
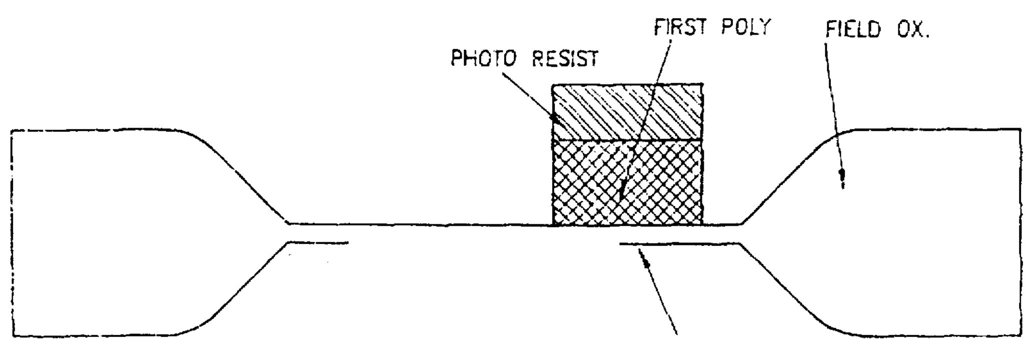

XVI. A first polysilicon layer deposited over the structure of the ridges. The first polysilicon layer is 3500 Å thick. It is doped to be conductive. XVII. A thin oxide transistor mask is used to define the low voltage CMOS transistors. As shown in FIG. 11 plasma etch is used to form the gates of the CMOS transistors as well as the polysilicon spacer 124 along the sidewalls of the nitride layer 112 as shown in FIG. 11.

Figure 12B:
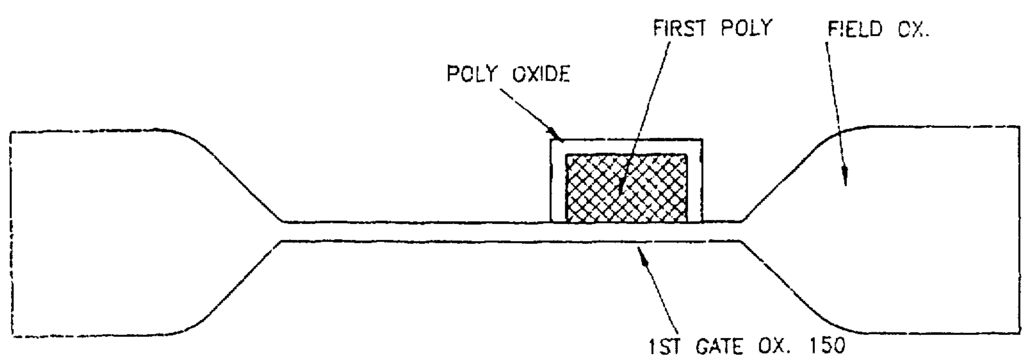
FIGS. 12B and 13B show cross sections of the semiconductor device of FIG. 1B in the cell area after the various stages of the steps of a process that embody the present invention.

XVIII. The circuit is masked and a source region 126 is implanted with arsenic. XIX. The oxide is removed from the channel region of the cell by an oxide dip. In the preferred embodiment, the oxide dip is a 30 second 50:1 HF dip. An oxide layer is then grown on this structure including a 325 Å oxide layer 128 is grown over the substrate 104 and a 900 Å oxide layer 130 is grown over the polysilicon spacer 124 as shown in FIG. 12.

XX. A hot phosphoric nitride etch is used to remove a portion of the nitride layer 118 that is above the tungsten 204. XXI. A tunneling oxide layer is grown over this structure. The thickness over the substrate is between 50–70 Å so that the gate oxide thickness for the cell is about 350 Å. About 150–200 of oxide is formed over the polysilicon spacer 124 so that the spacing between the floating gate (the space structure) and the control gate (not yet formed) is about 1000 Å as shown in FIG. 11. Note that a thin tunneling oxide layer is formed over the vertical sidewall of the floating gate.

XXII. A second polysilicon layer is formed over the structure of FIG. 13 to form the structure of FIG. 1. XXIII. The second polysilicon layer is masked and XXIV the mask is removed. The second polysilicon layer follows the contour of the floating gate so that it is spaced apart from the floating gate about 1000 Å along the curved surface that is oriented away from the substrate 104. The spacing between the floating gate and the control gate is only about 200 Å along the short length of overlap along the vertical sidewall. It is along this structure that tunneling will occur to erase the cell. The amount of the overlap between the floating gate and the control gate is about 700 Å. After the definition of Poly 2 and etching it, a self align mask is used to cover the periphery as well as the source of the cell. Using this mark the 1000 Å of oxide on top of floating Poly 42 and bit line 46 will be etched off. Using a non-vertical poly etch then the spacer 42 is removed from in between the control gates. During this etch about 2000 Å of tungsten will be etched away from the W filled bit lines leaving about 3000 Å of W in the bit lines.

The remainder of the steps in the process (XXXV through XXXXII) are for forming portions of the circuit separate and apart from the cell. The steps listed in TABLE I are representative of conventional steps for forming those steps and included only for completeness. A person of ordinary skill in the art would readily be able to develop other steps for forming those desired structures and circuits.

The present invention has been described relative to a preferred embodiment. It will be readily understood that the thicknesses and specific processing steps can and will vary according to the precise needs of any particular circuit design and process requirements. Such modifications which become apparent to a person of ordinary skill in the art only after reading this disclosure are deemed within the spirit and scope of this invention and the appended claims.

TABLE I

| Spacer Flash cell process | |
|---|---|
| I. | N-Well mask/process/implants. |
| II. | Diff. mask/Nitride etch/Field implant. |
| III. | Field Oxidation 9000 Å. |
| IV. | Tungsten bit line mask/plasma etch. |
| V. | As implant/remove resist. |
| VI. | Nitride Deposition. |
| VII. | Buried contact mask (to connect poly bit line to diffusion). |
| VIII. | Adhesion layer deposition (titanium nitride). |
| IX. | Tungsten deposition. |
| X. | Tungsten etch back. |
| XI. | Silicon Nitride deposition. |
| XII. | Silicon Nitride etch back. |
| XIII | Field Oxide etch mask. |
| XIV. | Vt adjustment implants. |
| XV. | Gate oxide 1 150 Å. |
| XVI. | Poly 1 deposition 3500 Å/dope. |
| XVII. | Thin oxide transistor mask + spacer formation. |
| XVIII. | As implant mask/As implant. |
| XIX. | Oxide dip/Grow gate oxide: gate oxide (high voltage) 300 Å (900 Å on poly) |
| XX. | Hot Phosphoric Nitride etch. |
| XXI. | Tunneling oxide: 70 Å on silicon 200 Å on poly (total gate oxide 350, total poly oxide 1000 Å). |
| XXII. | Poly 2 deposition/dope. (poly side) |
| XXIII. | Poly 2 mask. |
| XXIV. | Poly 2 removal self align mask/poly etch. |
| XXV. | LDD Ph. implant mask/Ph. implant. |
| XXVI. | Spacer oxide deposition. |
| XXVII. | Spacer etch. |
| XXVIII. | N + S/D implant mask/As implant. |
| XXIX. | P + S/D implant mask/Boron implant. |
| XXX. | S/D oxidation. |
| XXXI. | BPSG deposition. |
| XXXII. | Contact mask. |
| XXXIII. | Ti sputter/Nitradization. |
| XXXIV. | Metal 1 dep. |
| XXXV. | Metal 1 mask/etch. |
| XXXVI. | ILD deposition. |
| XXXVII. | Planarization. |
| XXXVIII. | Via mask/via etch. |
| XXXIX. | Metal 2 dep. |
| XXXX. | Metal 2 mask/etch. |
| XXXI. | Passivation. |
| XXXXII. | Pad mask. |

I claim:

1. A method of forming a nonvolatile memory cell comprising the steps of:

a. forming a planar substrate of a semiconductor material having a surface, wherein the substrate is doped to a first conductivity type having a drain region and a source region spaced apart from one another and formed within the surface;

b. forming a first conductive material having at least one planar first sidewall perpendicular to the substrate, wherein the first conductive material is formed over the drain region and spaced apart from the drain by a first insulating layer wherein the first insulating layer includes a substantially planar second insulating layer along a first sidewall that is coupled to the first insulating layer;

c. forming a second conductive material having a substantially planar second sidewall, wherein the second conductive material is formed over the substrate adjacent the first conductive material and between the drain and the source regions but spaced apart from the source region such that the second sidewall is coupled to the second insulating layer and further wherein the second conductive material is surrounded by a third insulating layer and wherein the second conductive material extends further from the substrate than the first conductive material leaving an exposed and insulated portion of the second sidewall; and d. forming a third conductive material formed over the substrate and extending from the source region to the drain region such that the second conductive material is between the third conductive material and the substrate such that the third conductive material is spaced apart from the second conductive material by a first distance along a surface of the second conductive material away from the substrate and the second sidewall and a second distance along the exposed and insulated portion of the second sidewall wherein the second distance is less than the first distance.

2. A method of forming a nonvolatile memory cell, comprising the steps of:

a. forming a field oxide layer on a semiconductor substrate;

b. forming an opening having sidewalls in the field oxide layer to expose a portion of the substrate;

c. doping a portion of the substrate through the opening for forming a drain;

d. depositing a thin first insulating layer over the exposed portion of the substrate and the sidewalls;

e. forming a first conductive layer within the opening and spaced apart from the field oxide layer and the substrate by the first insulating layer such that a portion of the first insulating layer is exposed within the opening;

f. removing the field oxide layer exposing that portion of the substrate not covered by the first conductive layer and the first insulating layer and exposing an outside sidewall of the first insulating layer;

g. forming a second insulating layer over the exposed substrate;

h. forming a doped polysilicon spacer along the outside sidewall and over the second insulating layer;

i. removing the exposed portion of the first insulating layer;

j. surrounding all exposed surfaces of the spacer with a third insulating layer such that the third insulating layer is a first thickness where the exposed portion of the first insulating layer was removed and a second thickness elsewhere such that the second thickness is thicker than the first thickness; and k. selectively covering the structure resulting from step j with a second doped polysilicon layer.

* * * * *